US 6,534,249 B2

(12) United States Patent
Fork et al.

(10) Patent No.: US 6,534,249 B2
(45) Date of Patent: Mar. 18, 2003

(54) METHOD OF MAKING LOW COST INTEGRATED OUT-OF-PLANE MICRO-DEVICE STRUCTURES

(75) Inventors: David K. Fork, Los Altos, CA (US); Christopher L. Chua, San Jose, CA (US)

(73) Assignee: Xerox Corporation, Stamford, CT (US)

(*) Notice: Subject to any disclaimer, the term of this patent is extended or adjusted under 35 U.S.C. 154(b) by 162 days.

(21) Appl. No.: 09/780,165

(22) Filed: Feb. 9, 2001

(65) Prior Publication Data

US 2002/0110758 A1 Aug. 15, 2002

(51) Int. Cl.[7] .............................. G03C 5/56; H01L 21/00
(52) U.S. Cl. ....................... 430/322; 430/320; 430/323; 430/324; 430/330; 336/200; 438/51; 438/52
(58) Field of Search .................................. 430/322, 323, 430/324, 330, 320; 336/200; 438/51, 52

(56) References Cited

U.S. PATENT DOCUMENTS

| 5,613,861 A | 3/1997 | Smith et al. .................. 439/81 |
| 5,848,685 A | 12/1998 | Smith et al. ................. 200/275 |
| 5,914,218 A | 6/1999 | Smith et al. .................. 430/320 |
| 6,396,677 B1 * | 5/2002 | Chua et al. ................... 361/277 |

OTHER PUBLICATIONS

Koenraad Van Schuylenbergh et al., Xerox Attorney Docket No. D/A0728, unfiled.
U.S. patent application Ser. No. 09/573,815, Christopher L. Chua et al., filed May 17, 2000.
U.S. patent application Ser. No. 09/573,363, Christopher L. Chua et al., filed May 17, 2000.
U.S. patent application Ser. No. 09/591,262, David K. Biegelsen et al., filed Jun. 9, 2000.

* cited by examiner

Primary Examiner—Mark F. Huff
Assistant Examiner—Daborah Chacko-Davis
(74) Attorney, Agent, or Firm—Jeannette M. Walder

(57) ABSTRACT

Several methods and structures for improving the yield of out-of-plane micro-device structures including springs and coils are described. Structures and methods for adjusting the coil diameter after spring release, if necessary, are also disclosed. In one method the radius of curvature of the released elastic members is controlled by depositing a layer of a reflow material and reflowing the layer after release. The high yield structures may be used in numerous electronic applications such as filter circuits.

11 Claims, 11 Drawing Sheets

FIG. 4
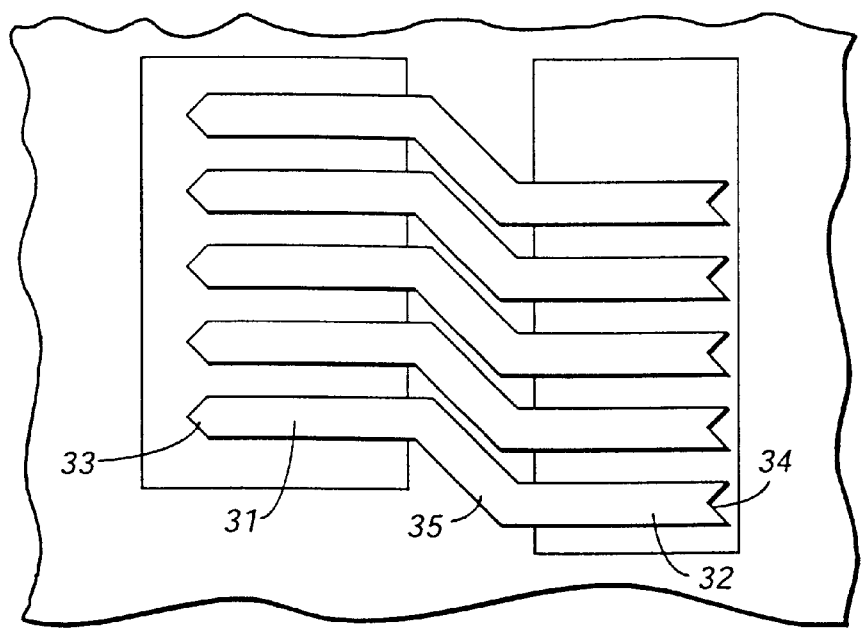
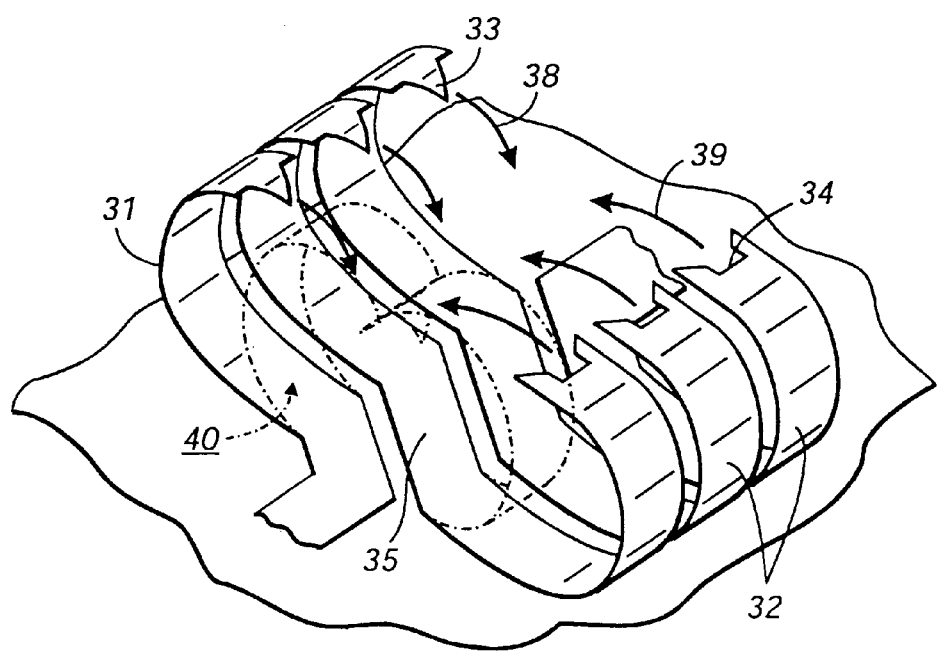
FIG. 5

METHOD OF MAKING LOW COST INTEGRATED OUT-OF-PLANE MICRO-DEVICE STRUCTURES

CROSS-REFERENCE TO RELATED APPLICATIONS

This application is related to copending, coassigned U.S. patent application Ser. No. 09/573,815 filed May 17, 2000, "Photolithographically-patterned out-of-plane coil structures and method of making" (the "'815 application") and to copending, coassigned U.S. patent application Ser. No. 09/591,262 filed Jun. 9, 2000, "Photolithographically-patterned out-of-plane coil structures and method of making" (the "'262 application").

FIELD OF THE INVENTION

This invention generally relates to photolithographically-patterned, out-of-plane micro-device structures for use in integrated circuits, circuit boards and other devices and methods of making such structures.

BACKGROUND OF THE INVENTION

Copending, coassigned U.S. patent application Ser. No. 09/573,815 filed May 17, 2000, "Photolithographically-patterned out-of-plane coil structures and method of making," describes various photolithographically produced out-of-plane coil structures and methods of making such structures, which is incorporated herein by reference. These structures are particularly advantageous for forming several practical electrical components for integration on silicon substrates. Out-of-plane inductors, for example, offer several advantages over prior art planar inductors, in that out-of-plane structures minimize eddy currents induced in the underlying substrate and when out-of-plane coils are operated at high frequencies, skin and proximity effects are better controlled.

Out-of-plane coil structures place the coil axis parallel, rather than perpendicular, to the substrate plane. An out-of-plane coil structure includes a substrate and an elastic member having a first anchor portion fixed to the substrate, a loop winding and a second anchor portion connected to the substrate. The second anchor portion and the loop winding are initially fixed to the substrate, but are released from the substrate to become separated from the substrate. An intrinsic stress profile in the elastic member biases the second anchor portion away from the substrate forming the loop winding and causing the second anchor portion to contact the substrate. The resulting coil structure is out-of-the plane of the substrate. The loop winding may also include a plurality of turns.

Various techniques may be used to position the second anchor portion away from the takeoff point of the elastic member, either tangentially or axially. If the second anchor point is positioned tangentially from the takeoff point, the loop winding is generally in the shape of a distorted circle, i.e., the second anchor portion contacts the substrate in the same vertical plane as the first anchor portion. Various techniques may be used to position the second anchor portion tangentially from the takeoff point. For example, a mechanical stop can be fixed to the substrate at the desired location to catch the second anchor point while it is detached from the substrate. Also, the radius of curvature of the elastic member may be varied, such as by adding a load layer onto a portion of the elastic member or by patterning one or more openings or perforations into a portion of the elastic member.

Various techniques can be used to connect the second anchor portion to the substrate. For example, the second anchor portion can be soldered or plated to the substrate. Each anchor portion can be attached to a metal contact pad attached to the substrate, for providing electrical connectivity to other elements in a circuit. Preferably the elastic member is formed of a conductive material. Alternatively, a layer of a conductive metal, such as gold, copper or silver, may be formed on an inner surface, an outer surface, or both surfaces.

An alternate method for forming an out-of-plane coil based on closing half loop pairs of elastic members as disclosed in copending, coassigned U.S. patent application Ser. No. 09/591,262 filed Jun. 9, 2000, "Photolithographically-patterned out-of-plane coil structures and method of making" is incorporated herein by reference. Upon release the half loop pairs need only to be coarsely aligned to each other and connected together, such as by either plating or soldering. The loop halves need not be the same length. One side could be longer than the other to facilitate the overlap. A different release material may be used under each loop half to release the loop halves sequentially.

One difficulty in creating out-of-plane structures is ensuring that the elastic members used to form the loops are not bunched or entangled by hydrodynamic and surface tension forces when they are being released. It has been observed that aqueous release and drying of the released elastic members causes insufficiently stiff fingers to get pulled around by the air liquid interface and stick together. The longer and narrower the released elastic members the greater is the problem. A related defect occurs when released elastic members intertwine. Another difficulty is providing enough contact area for the free end of the released elastic member where it makes mechanical contact for subsequent electro-forming. A further difficulty is calibrating and maintaining the stress parameters in the metal deposition process in order to keep the diameter of the coil, and as such its inductance, within a few percent tolerance.

SUMMARY OF THE INVENTION

The invention describes several methods and structures for improving the yield of out-of-plane structures, including coils and springs. Out-of-plane springs may be used in applications such as flip-chips and probe cards as well as in variable capacitors. An out-of-plane structure, according to one aspect of the invention includes a substrate and at last two spaced-apart elastic members, each elastic member including an anchor portion, a spring and a free end, the anchor portion being fixed to the substrate, the free end being disposed away from the substrate. The free end and the spring are initially fixed to the substrate, but are released from the substrate to become separated from the substrate. An intrinsic stress profile in the elastic member biases the free end away from the substrate forming the spring. A tether layer disposed across (or joining) the elastic members maintains the spaced-apart position of the springs with respect to one another during release and after. This structure produces out-of-plane spring shaped structures or cantilevers. When the springs are made wider, they can be used as the variable plate of a capacitor. When the elastic members are made longer and the intrinsic stress profile increased sufficiently so that the free end contacts the substrate, the elastic members produce loop windings. These structures can be used as inductor coils or transformer coils.

The tether layer is disposed from one elastic member to the other (or joins two elastic members) in order to maintain the relative position of the two members during release. If the structure includes more than two elastic members, the tether layer may extend across or join all members. While in general, for multiple elastic members, a single tether extending across all of the elastic members may be easiest to deposit and pattern, it should be noted that a tether need only join adjacent elastic members, i.e., a plurality of individual tethers, one for each adjacent pair of elastic members, may also be used. Generally, the tether layer will be approximately perpendicular to the length of the elastic members, but may be placed on a diagonal. More than one tether layer may be used for lengthy elastic members. In one embodiment, the elastic members are formed of an electrically conductive material and the tether layer is formed of a non-conductive material. After release and any subsequent processing steps, the tether layers may be removed or remain intact. This embodiment may be easily combined with one or more of the other embodiments described below.

By placing one or more tethers joining the elastic members prior to release, the floppiness problem of very long flexible released elastic members is essentially eliminated. The tethers on the elastic members release along with the elastic members, and maintain spacing and separation of the individual released elastic members. The tethers may be made sufficiently narrow or perforated to ensure that the release etch releases the tethers along with the released elastic members (to promote release, if the released elastic members are perforated, the perforations will generally extend through to the release layer). The tethers maintain uniform array spacing and prevent the released elastic members from touching or entangling. The ensemble of tethered released elastic members behaves like an effectively stiffer structure. The tethers actually constrain the undesired flexures of the released elastic members relative to one another, while leaving the curling behavior of the released elastic members largely unchanged. There can be a loading effect due to the tether that effectively changes the radius of the released elastic member relative to what it would be without the tether. Design considerations can allow for this effect.

The tether structure has utility anywhere that a floppy out-of-plane structure would otherwise suffer from unconstrained flexure, including applications for coils and out-of-plane spring cantilevers such as flip chip packages and probe cards. For example, tethers can be used to hold the springs in uniform registration during release and a subsequent plating step that substantially stiffens the structures.

Rate of release of the elastic member used to form an out-of-plane structure is controlled in another embodiment of the invention. An out-of-plane structure includes a substrate and an elastic member including a first anchor portion fixed to the substrate, a spring and a free end. The elastic member further includes a plurality of perforations unequally spaced apart from one another in the spring. The free end and the spring are initially fixed to the substrate, but are released from the substrate to become separated from the substrate. An intrinsic stress profile in the elastic member biases the free end away from the substrate forming the spring. On release of the free end, the perforations in the elastic member control a rate of release of the elastic member from the substrate. Undercut etching occurs both under the edges of the elastic member and the edges of the perforations. Perforations may also be used to control release of elastic members which form loop windings when the free end contacts the substrate.

Perforations in the material of the elastic member allow etchant to have greater access to the interior portions of the member segment, and thereby allow the elastic member to release faster with less undercut etching at the member base. By grading the perforation density, or having the perforations unequally spaced along the member, the elastic member then releases from the substrate in a controlled fashion starting with the tip or free end, and progressing toward the base or anchor portion. This can be important because of the large amount of elastic energy that is stored in the elastic member. If the release rate of the energy is too rapid, the elastic member can reach enough speed to entangle with other elastic members or break. Gradual, controlled release of the elastic member allows mechanical damping enough time to limit the total kinetic energy of the elastic member to a non-destructive level.

The perforations, if made small enough, may be closed off after elastic member release by electroforming them with a suitable metal such as copper. If the free end is attached by electroforming (to form a loop structure, for example), the perforations can be closed off in the same plating bath during the released elastic member attachment process.

Controlling the radius of curvature in both spring structures and coil structures is often required by design considerations. One of the ways of controlling the radius of curvature of the coil structures is to deposit a load layer on the elastic member prior to release of the elastic member. In accordance with another embodiment of the invention, further control can be achieved by depositing the load layer using a reflow material, i.e., any material that softens at a process compatible temperature. An example of a suitable reflow material is photoresist, but other suitable reflow materials may also be used. The load layer of reflow material can be introduced in the same masking step that creates the release window, or it can be introduced in a separate step. One desirable feature of using a photoresist load layer is that the loading effect of the resist can be gradually changed with heat and clean up is easily accomplished with plasma ashing.

In accordance with another embodiment of the invention, the radius of curvature may be further controlled by depositing a multilayer load layer. By depositing a multilayer load layer, the radius of curvature may be controlled by selectively etching away individual layers of the load layer.

In accordance with another embodiment of the invention, an out-of-plane coil structure, may be formed by joining two elastic members in mid-air. To facilitate latching of the two elastic members, one free end includes an elongated tip and the other free end includes a tip having a groove for receiving the elongated tip. The two free ends can be easily connected by soldering or plating.

In accordance with another embodiment of the invention an out-of-plane coil structure may be formed by joining two elastic members in which one side may lift away from the substrate by only a small amount, providing a tab that acts as a mechanical stop and/or alignment structure for the other elastic member in the pair. In addition, the longer member of the pair of elastic members may contact both the tab and the substrate.

To facilitate formation of out-of-plane coil structures an extended "Y" and "U" base pad structure may be used. An elongated tip is formed at the free of the elastic member before release. The anchor portion is formed in the shape of an inverted "U" permitting the extended tail of the "Y" shaped contact pad for an adjacent elastic member to be positioned within the inverted "U". Thus after release the tip will bisect the extended tail portion of the Y facilitating coil completion.

BRIEF DESCRIPTION OF THE DRAWINGS

This invention will be described in relation to the following drawings, in which reference numerals refer to like elements and wherein:

FIG. 4 is a top view of a layout of five mid-air elastic member pairs before release;

FIG. 5 is a partial perspective view of the member pairs of FIG. 4 during release;

DETAILED DESCRIPTION OF THE PREFERRED EMBODIMENTS

The methods and structures of the invention employ some of the same techniques disclosed in the '815 application and the '262 application as well as the techniques used to make springs as disclosed in coassigned U.S. Pat. Nos. 5,613,861, 5,848,685 and 5,914,218. Springs are made by introducing an intrinsic stress profile of a certain amount designed to produce the desired spring height and curvature. Similarly, as disclosed in the '815 and '262 applications, a reproducible built-in stress gradient or intrinsic stress profile can be designed into a thin film by varying the growth conditions appropriately during deposition to produce coil structures, i.e., a released elastic member which bends back on itself producing a loop winding and contacting the substrate. By using or adding one or more conductive layers, a coil structure suitable for use as an inductor or a transformer may be manufactured.

Figure 1:
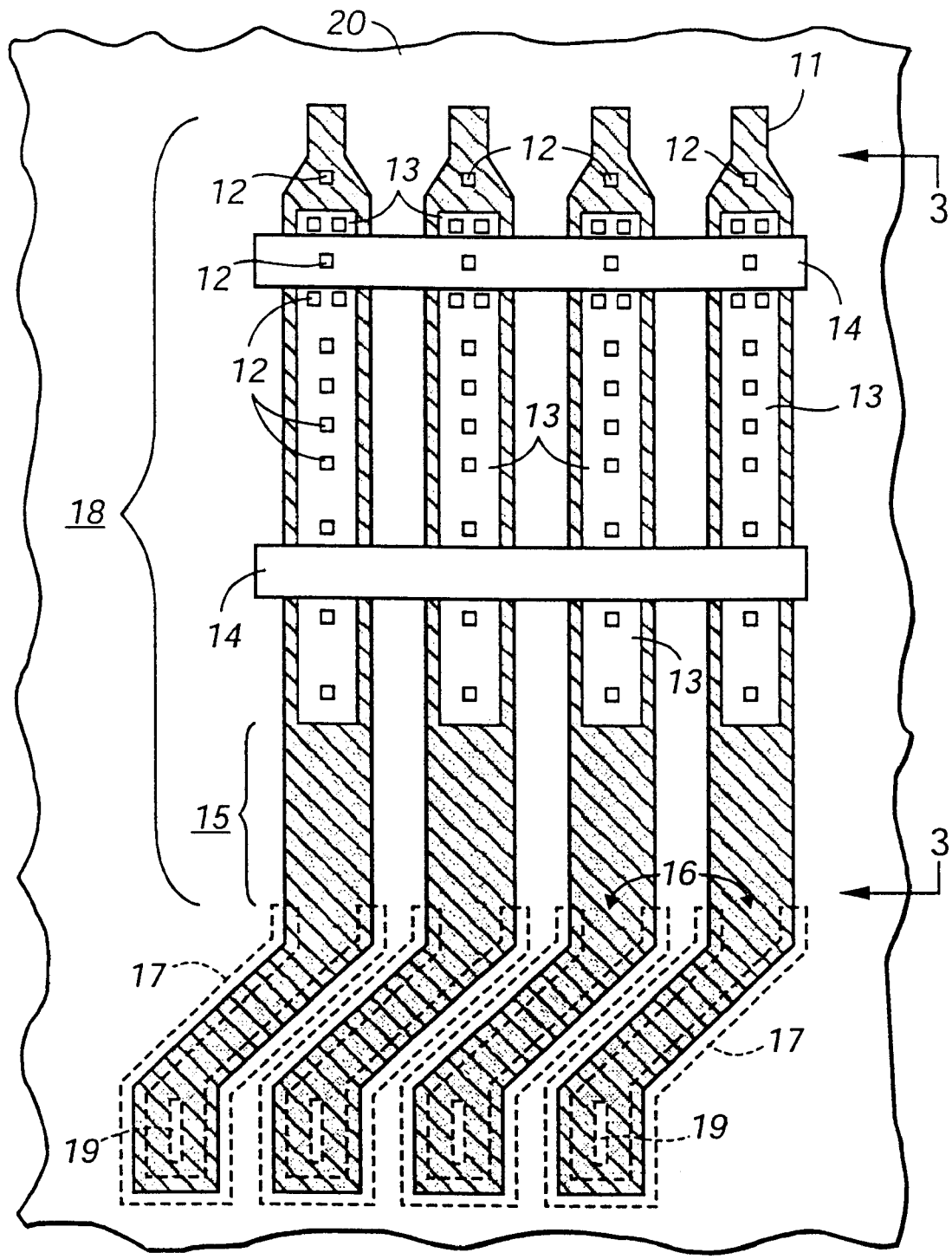
FIG. 1 is a top view of a layout of four tethered elastic members before release.
Figure 3:
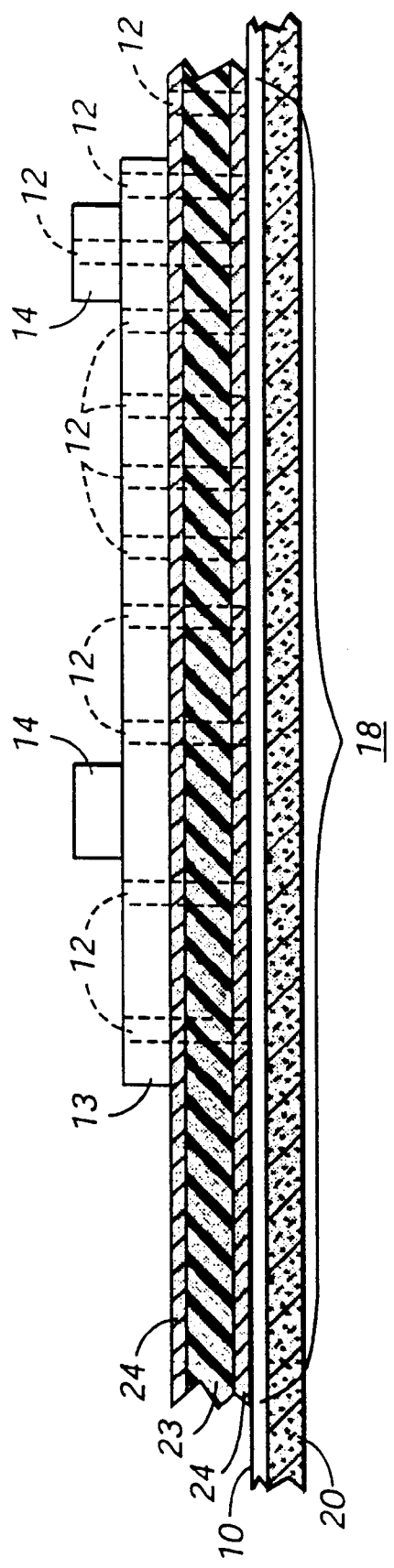
FIG. 3 is a cross section along line 3—3 of FIG. 1.

Referring to FIGS. 1 and 3, a release layer 10 such as Ti, Si, or SiN is patterned on substrate 20. The substrate may be any material that can survive the processing conditions, which includes a wide variety of materials due to the inherently low process temperatures involved in the fabrication of stress engineered materials. These substrate materials include glass, quartz, ceramic, silicon and gallium arsenide, as well as substrates with existing passive or active devices. The release layer 10 may be a material that can be quickly removed by selective dry or wet undercut etching. Possible etchants for a Si release layer include KOH (wet processing) and $XeF_2$ (dry processing). Hydrofluoric acid will etch Ti or SiN release layers.

A layer of an elastic material is deposited on substrate 20 and patterned into four individual elastic members or fingers 18. Each finger 18 can be formed of a single elastic material 23, such as a stress graded film of NiZr, Mo/Cr, solder-wettable Ni, or other suitable material. Alternatively, each finger 18 can be formed of two or three layers: a bottom gold layer 24, for example, can be used to form the outer skin of the coil when released and provides a high conductivity path for electrons at high frequencies. A second gold layer (not shown) can be deposited on top of layer 23 to passivate the surface. The added layers may also serve as a seed layer for subsequent plating. Depending on the design required, any metals capable of holding large stresses may be used to form the parts of the finger that induce bending, and clad them with additional layers that are good seed layers for plating. Alternately, the stresses may be placed into a material that contains the required bending moment and is also suitable for plating or soldering, for example Ni or its solution hardened alloys.

Figure 6:
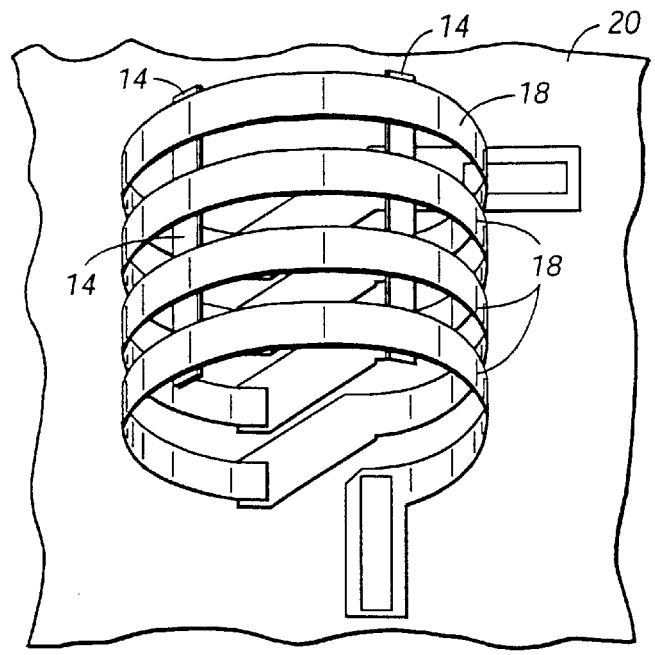
FIG. 6 is partial perspective view of the tethered elastic members of FIG. 1 after release and formation of coil structures.

Referring to FIG. 1, two cross tethers 14 were deposited and patterned to connect or join at least from one released elastic member 18 in the array of four fingers 18 to one additional released elastic member 18 in the array. Tethers 14 are shown as substantially perpendicular to the length of members 18, but may be disposed diagonally or some other convenient orientation for maintaining the spaced-apart separation of the released elastic members. The release mask 17 allows a release etch to undercut both the released elastic members 18 and the tether 14. Although two tethers 14 are shown in FIGS. 1 and 3, only one may be used or more than two may be used. The tether 14 may be perforated with one or more perforations 12 to allow release etchant to pass through the tether layer 14 through an aligned hole 12 in the elastic member layer 18 in order to more rapidly release the finger 18. In FIG. 1, a tether layer 14 is placed near the four tips 11; a second tether layer 14 is placed near the center of the fingers 18. FIG. 6 shows the released coils formed into connected coils 18 with tether layers 14 still in place.

The tether layers minimize or eliminate the floppiness problem of very long flexible released elastic members (the longer the released elastic members, generally the greater the problem). Longer, thinner released elastic members also have a tendency to intertwine after release. By placing cross-tethers on the elastic members that release along with the elastic members, this problem is also eliminated. The tethers are made narrow enough to ensure that release etch releases them along with the elastic members. The tethers maintain uniform released elastic member element array spacing and prevent the released elastic members from touching or entangling after release and when the tips are being connected to their respective pads. The ensemble of tethered released elastic members behaves like an effectively stiffer structure. The tether material should be non-conducting in order to provide electrical isolation of electrically conductive released elastic members.

The out-of-plane coil structures are particularly beneficial when used as inductors or transformers in integrated circuits. While the individual released elastic members may be formed of a metal stress graded material, or multi-layers of metal and stress graded material, in many applications, the structure will be plated with metal in a plating bath after the released elastic members are released and the free ends connected to the contact pads. As described below, resist reflow is used to protect certain areas of the structure from the plating bath. The reflow step could also be used to reflow the tethering material, particularly if the tether material is the same as the reflow material. If the amount of reflow is too large, the tethers could neck down and even separate into drops of resist on each finger. To avoid this, a separate mask can be used to define the tether layer, or the tether layer can be combined with the load layer (if a load layer is added to the structure—as described below) into a single layer separate from the release layer. If, for example, the release layer is made of resist, the tether-load layer could be made of polyimide. Reflow of the resist would not reflow the polyimide, because of the wide separation of their glass transition temperatures.

When a separate tether-load layer material is used, when the release window 16 is removed the exposed release metal that was used as a common cathode can be cleared away. The tethers may remain in place for this and subsequent dicing and packaging steps because although the plating step stiffens the released elastic members, once the tethers are removed, individual released elastic member loops may bend into adjacent loops. The tethers can and will typically be removed after electroforming. However, there may be some applications where it will be appropriate to leave the tethers in place.

If the tethers are combined into the release window mask, no added mask count is needed to implement the tether layer, making it effectively zero cost. The tethers proposed can be implemented in the release window material that in the process flow serves to define where the released elastic members lift and also where the electroplating occurs. If the tethers are not combined with the release mask, then a three mask process may be needed, which is still possible to implement at low cost.

The rate of Ti release layer undercut below both released elastic member metal and photoresist has been characterized. The undercut rate in the release etch under both released elastic member and tether materials is identical and rapid. Release times for released elastic members with 200 nm Ti is on the order of 0.34 microns/sec, meaning that 50 micron wide released elastic members take about 74 seconds to release. Tethers narrower than 50 microns will release during the same process. Much narrower tethers may be used, on the order of 20 microns; these tethers will interfere even less with the release process. Tethering effectively reduces the length-over-width ratio of the released elastic member segment. The inventors have demonstrated that 100% yield without bunching or tangling is routine if length/width limits are not exceeded.

After release and coil closure, the tethers are located on the inside of the coil. At high frequencies, currents flow on the outside of the coil (made of an electrically conductive material) due to the skin effect. To avoid shorting between adjacent coils formed of an electrically conductive material, the tether material should be made of a non-conductive material. No plating will occur where an insulating tether resides, however this will have no significant electrical effect on the final device.

One of the coil embodiments described in the '815 application and the '262 application are toroidal structures. Because the tethered released elastic members are generally parallel, true toroidal structures may not be able to use tethered released elastic members. However, the inventors have conducted recent experiments demonstrating that square shaped toroids work effectively just as well as round ones as far as device quality factor matters.

As noted above, the use of tethers is not limited to coil structures. Any cantilever structure that requires additional constraint to overcome problems associated with floppiness will benefit from tethering. In particular, in structures such as probes and packages, where the cantilever may be further stiffened by subsequent electroplating, or constrained by flip chip contact, the tethers can serve to make the process more robust. The use of tethers can be combined with one or more of the following additional embodiments of the invention, or one or more of the following additional embodiments may be used alone.

In accordance with another embodiment of this invention, a graded density of perforations 12 disposed along the length of the spring 18 may used to control the rate of release of the released elastic members 18. FIGS. 1 and 3 show one way in which a graded perforation density may appear in the layout of a coiled spring array. Note that the spacing between perforations 12 is increased gradually from the tip 11 to the base of the released elastic member 18. Note also that, if a load layer 13 (described below) is also present, perforations 12 in the loaded section 13 of the beam 18 go through both the load layer and elastic member layers 23 and 24.

The graded perforation density in elastic members 18 enables the release from the substrate to be in a controlled fashion starting with the tip 11, and progressing toward the base. This is important because of the large amount of elastic energy that is stored in the elastic member before release. If the release rate of the energy is too rapid, the elastic member can reach enough speed to entangle with other elastic members or break. Gradual release of the elastic member allows mechanical damping enough time to limit the total kinetic energy of the spring to a non-destructive level.

Perforations may also be used to create varied inductance values from one individual coil to another or from a series of coils to another. Typically, for a given thin film deposition sequence, only one coil area is created. This happens because typically only one main radius is created, and if a load layer is used, one loaded radius. To obtain different inductance values, the number and pitch of the windings must be varied. The number of windings can only be varied discretely, hence, the pitch must be used to fine tune inductance values for a given loop area. If a design calls for more than one inductance, then there will be varied finger widths. To ensure that the fingers all release at approximately the same time, with the same release layer undercut, the use of graded density perforations, with the same approximate densities is required. The graded perforation density can be used to ensure that all elastic members release at the same rate, regardless of width.

Tethers may be used in addition to the graded perforation density. In some cases, it may be possible to locate the tether layers in between perforations. In other cases however, if the tether must pass over a perforation, that area of the tether must be either removed or perforated so that the release etch is not blocked. If a load layer is present, the perforation should pass through the load layer so that release etch is not blocked. Any structure pertaining to the load layer that is present during elastic member release must not block the release etch from passing through the elastic member perforations. This typically calls for making perforations in both the spring definition mask and in the load layer definition mask in order to define an operational perforation 12.

Load layers have been used to vary the radius of curvature of the elastic member. The load layer 13 is an additional layer patterned on the elastic member 18 to apply stress that either increases or decreases the bending radius. The load layer 13 is patterned to reside generally in the middle segment of the elastic member 18. The load layer is typically made of metal, such as gold, Mo, MoCr alloy, Ni, Ni alloy etc.

The inventors have determined that a load layer made of a reflow material such as photoresist can be advantageously used to load elastic members 18 to increase the radius in comparison to the same beam without the resist. The resist can be introduced in the same masking step that creates the release window, or it can be introduced in a separate step. The resist has very low intrinsic stress when it is processed. Once the spring is released, the resist is typically on the inside of the bending cantilever, and therefore it accumulates compressive stress as it opposes the bending. One desirable feature of the resist is that the loading effect of the resist can be gradually changed with either heat or plasma ashing. Heat permits the resist to soften, and above its glass transition temperature, to flow. For Shipley 1813 resist, it was observed that the loading effect was substantially reduced at 185 C, and was further reduced at 200 C. The loading effect can be substantial. In one experiment, the inventors altered the released elastic member diameter from 495 down to 345 microns.

Plasma ashing of the photoresist load layer 13 is another way to control the released elastic member diameter. Ashing permits gradual controlled reduction of the resist thickness without attacking the spring metal. As the resist thickness is reduced, the diameter shrinks.

The resist defining the release window will typically be reflowed in order to seal off the edge of the release metal to block plating along the edge of the window. This reflow step may relax some or all of the load created by the loading resist. If desired, the load layer resist and the release window resist can be two separate materials with different glass transition temperatures.

Using a load layer formed of a reflow material such as resist, increases the stiffness and radius of the released elastic members while they are still in the release etch. Once the released elastic members are removed and dried, the reflow step tightens the radii. This can be performed in air, where there is reduced likelihood of sticking or entangling. The trajectory of the free end of each cantilever is therefore determined by a two step process of first releasing the elastic member and then reflowing a reflow load on the released elastic member. This two step trajectory is preferred because the step of placing the tip to its target contact point can be done slowly and in air in the absence of surface tension forces.

As disclosed in the '815 application, a load layer of sputtered material, preferably metal can be introduced to produce a loaded section of an acircular beam. The loading effect of the metal can be controlled by selecting the layer thickness, intrinsic stress and modulus. Since it is desirable to keep the layers thin in order to minimize etch times and undercut, utilization of non-zero stress to minimize the amount of metal needed may be advantageous. For a given material, the elastic modulus is fixed, however, the stress may be controlled to minimize the required thickness. For example, a compressive load applied to the inside surface of a beading beam will expand the radius of the beam more than a neutral or tensile load.

The width of the load layer can be varied in order to adjust the amount of change induced in the released elastic member. For example, by applying a load layer that exactly balances the bending moment of the released elastic member when its width equals that of the released elastic member, the radius of the loaded elastic member can be varied from infinity down to the released elastic member's natural radius by varying the width of the load layer. Different springs, or different segments within released elastic members can have different radii without introducing more than one load layer by simply altering the load layer width.

To control the thickness of the load layer and the resulting stress, the load layer may be a multilayer. The layers that comprise the released cantilever can include a bottom layer of seed metal for plating, the layers of stressed spring metal, a top layer of seed metal, a layer of load metal, and additional seed metal in case plating is desired on the loaded segment. The load layer may be fabricated from the same material as the spring metal. This simplifies the processing. All of the layers can be deposited in the same deposition apparatus by sequential deposition.

Gold can be used as the seed metal for plating. The seed metal will have some loading effect of its own. It is possible therefore to load the beam with the multiple layers of seed metal. Gold is soft however, and has a smaller modulus and yield stress than the metals typically used for the springs. More efficient loading can be achieved with spring metals such as MoCr. Ni and Cu are also possible seed metals for plating, and may have a cost advantage over gold.

Figure 12:
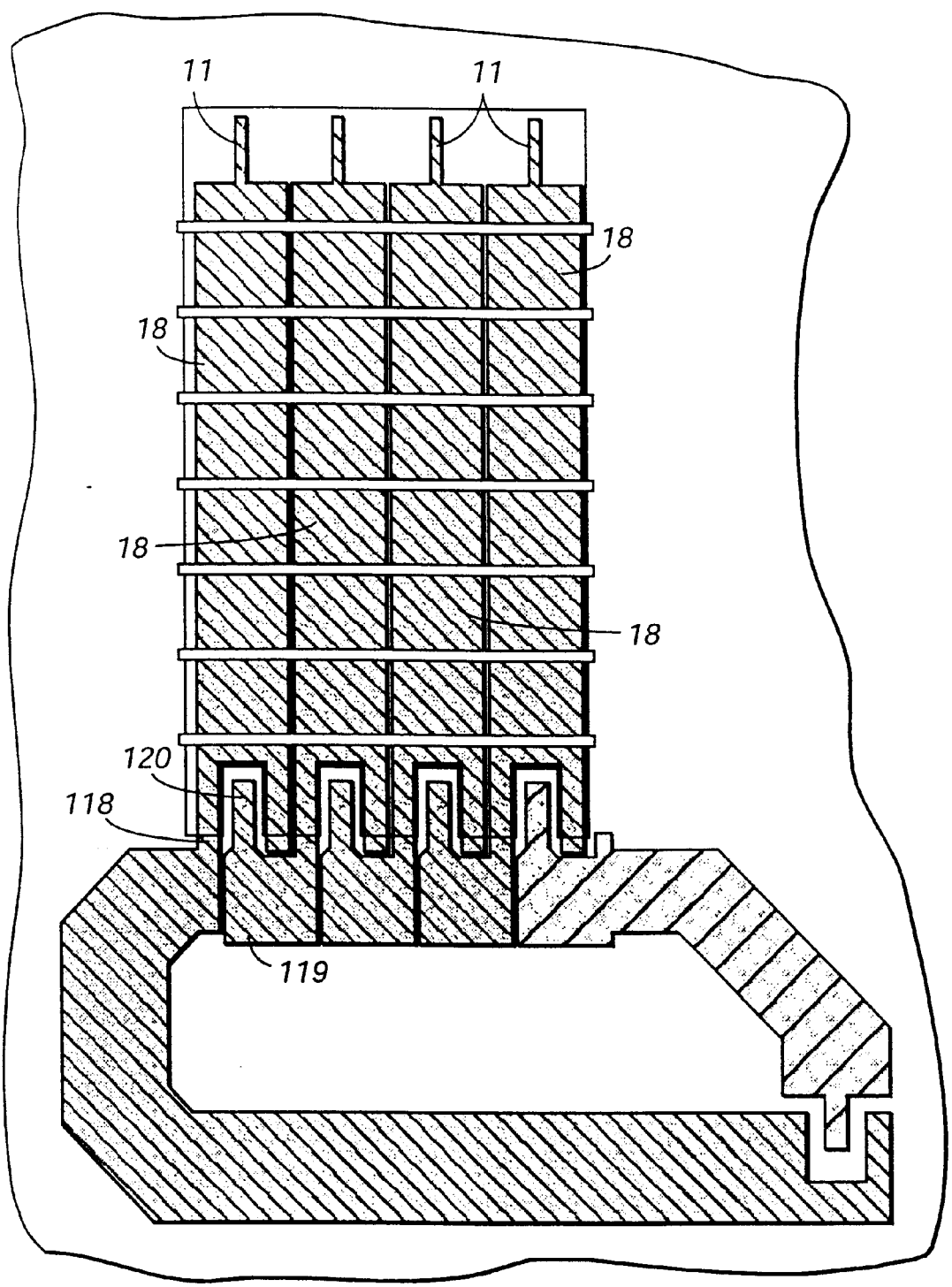
FIG. 12 is a top view of yet another alternate layout of four elastic members before release.

One configuration for making a multi-turn coil out of a series of individual coils is to pattern the base of the elastic member in the shape of an inverted "Y" or "U". Referring to FIG. 12, elastic members 18 include inverted base pads 118 (in the shape of a "U"). The contact pad 119 for an adjacent coil can then be positioned within the space provided by the "Y" or "U" configuration of base pad 118. One way to increase the yield of the Y-spot loop (as described in the '815 application) is to extend a narrow tip 11 on the elastic member 18 to allow this tip 11 to bisect an extended portion 120 of the Y past the contact pad 119. This permits coil completion without shorting, even if the radius is tighter than required to stop the free end 11 at the contact pad 119. It is worth noting that since the inductance is proportional to the loop area which varies quadratically with radius, the percentage error in inductance is twice the percentage error in radius.

This sensitivity to radius error is of concern for several reasons. First, process nonuniformity within the sputter tool will produce some variation in the radius within a wafer and from wafer to wafer. Further variations can occur from run to run. It is highly desired to reduce the sensitivity of the loop area to process variations that cause the actual radius to deviate from the design radius. One way to achieve this is to cause the free end to hit a mechanical stop of some kind. This forces the coil area to depend on physical layout variables rather than process variables. The mechanical stop can take a variety of forms, and provide several levels of constraint.

Figure 2:
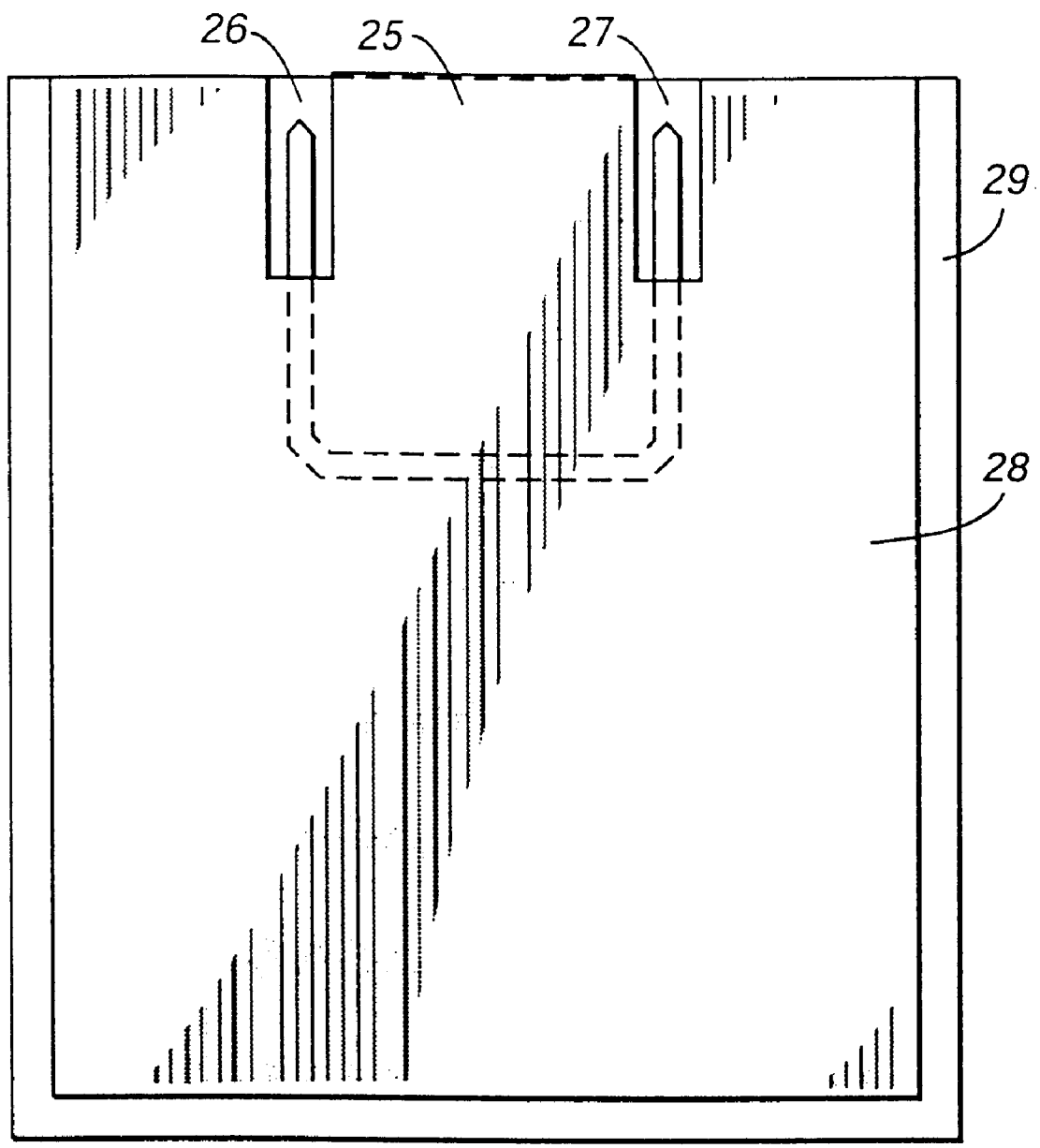
FIG. 2 is a top view detail of a raised mechanical stop on a contact pad.

One simple constraint illustration is provided by the acircular loaded beam. By simply loading a forward segment of the finger 18 (such as by depositing a load layer 13 to a smaller length than shown in FIG. 1), the tip 11 is forced to hit the substrate rather than wrapping inside the coil. The substrate provides a degree of mechanical constraint on the tip since the tip cannot penetrate the substrate. The free end tip 11 can still slide on the surface. To constrain the tip 11 further, a raised stop 25 on the surface of the landing pad can be introduced to prevent the free end from sliding closer than a given distance towards the takeoff point. Further, lateral raised stops 26, 27 (FIG. 2) can be placed to either side of the landing pad to guide the tip 11 and to prevent it from sliding to either side. The edges of the lateral stops can further be tapered in a horn like structure to gather the free end 11 of the finger 18 and funnel it into its desired location. The mechanical stops should not block the entire cross section of the pad available for plating, since this might create a segment of high resistance in the coil. To produce a stop, it is only necessary for the stop to touch a portion of the free end 11 in order to constrain its movement. Tip 11 is shown as tapered to facilitate positioning and final connection to the contact pad.

The stop can be formed from a released elastic member. If formed from a released elastic member, no additional masks are needed to make the stop. A loop formed by such a structure will have a long elastic member and a short elastic member or tab. The long and short elastic members can interlock with each other to constrain their positions. Additionally, the design can provide for the long elastic member touching both the short elastic member and the substrate if desired. Design constraints may be included in the coil such that errors in the fully relaxed radii of the segments do not produce proportionate errors in the coil cross-section. Structures that close until they hit a stop and then stop without fully relaxing have this desired property.

In addition to or in place of a mechanical stop, a tacking operation that adheres the tip in its desired location prior to plating is a useful structure for improving device yield. By tacking the tip in place, it is less likely that the electroplating bath can move the tip 11 before the electroforming operation solidly anchors the tip. The tacking can be achieved for example by melting and flowing a small amount of material between the tip and pad, and then hardening it. This would be the natural outcome of designing in a small amount of release window material at the contact point. The reflow operation described above will also tack the tip in place. This can therefore be implemented with no change in cost. The tacking area is intentionally kept small to minimize the contact resistance. The tethers further serve to ensure that the tips that are not fully tacked remain in proximity to the pad. FIG. 1 item 19 shows a strip of release window material that could be used to tack the tip in place.

It is highly desirable to be able to tune the radius of the elastic member 18 after release, especially if the sputter process produces a radius that is not the desired radius. This can be achieved by surrounding the elastic member with additional layers of metal that can be selectively etched away to alter the load on the released elastic member. Each time a layer is removed, the released elastic member will bend by a small amount, allowing the radius to be tuned. When the radius is tuned correctly, the processing can then continue onto the electroforming step. By making the layers thin and/or properly adjusting their stress, the amounts of radius change can be kept small, on the order of a few percent.

No added mask count is needed to implement radius tuning, because the selective nature of the etch defines the start and stop points of the layer removal. Further, no additional materials are needed, since the multilayers utilized can for example consist of the spring and seed metals (e.g. MoCr and Au) already used.

To make radius tuning compatible with plating, it must be ensured that after the radius is tuned, the surface exposes metal that can be plated. In the current industry practice, this means making bilayers of Au and MoCr, and etching down to the next layer of Au.

An alternate method of forming an out-of-plane coil structure in which two half loops are closed in mid-air forming a loop winding is shown in FIGS. 4 and 5. The elastic layer is photolithographically patterned into a series of individual elastic members. Each individual elastic member includes a first elastic member 31, a contact portion or bridge for connecting between adjacent loop windings 35 and a second elastic member 32. First elastic member includes an end portion 33 in the shape of an elongated tip and second elastic member includes an end portion 34 having a groove for receiving elongated tip 33. This structure of tips 33 and 34 facilitates catching of the two springs after release so that the two portions may be connected via soldering or plating. The loop winding is formed by removing the release window under each first elastic member and each second elastic member. This can be done at the same time, or sequentially, by using a release material under all the first elastic members different from under all the second elastic members. The first and second elastic members can also be released at different times by placing different perforation densities on them. This causes tip 33 to move in the direction of arrow 38 and tip 34 to move in the direction of 39. When the two tips meet, they are joined at point 40. Pressing and heating causes the solder to reflow and join free end 33 to free end 34.

Figure 7:
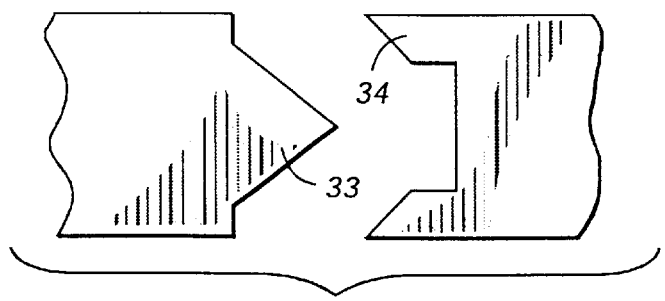
FIGS. 7 and 8 are top views of alternate elastic member tips.
Figure 8:
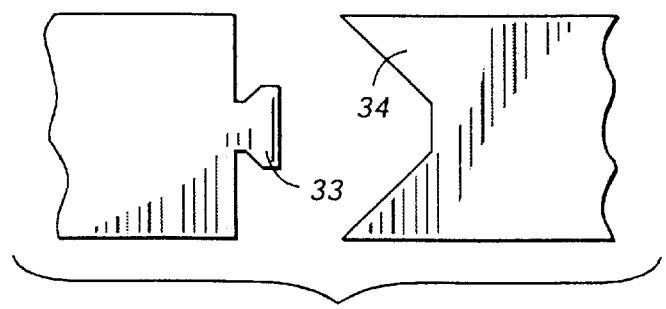

The elongated tips 33 may be, for example shaped as shown in FIG. 7 or FIG. 8. In addition to the shape shown in FIG. 5, end portion 34 may be of the shape shown in FIG. 8. Other variations are possible.

Alternatively, the free ends (without solder) can be connected together by plating. Immersion in a plating bath and depositing metal on accessible metal surfaces both thickens all metal lines and creates bridges between proximal surfaces.

The individual loop halves are shown in FIGS. 4 and 5 as being of approximately the same length. However, the lengths can be varied to aid in the coil formation process. For example, the first elastic members can be made shorter than the second elastic members to ensure that the second elastic members overlap the first elastic members.

Figure 9:
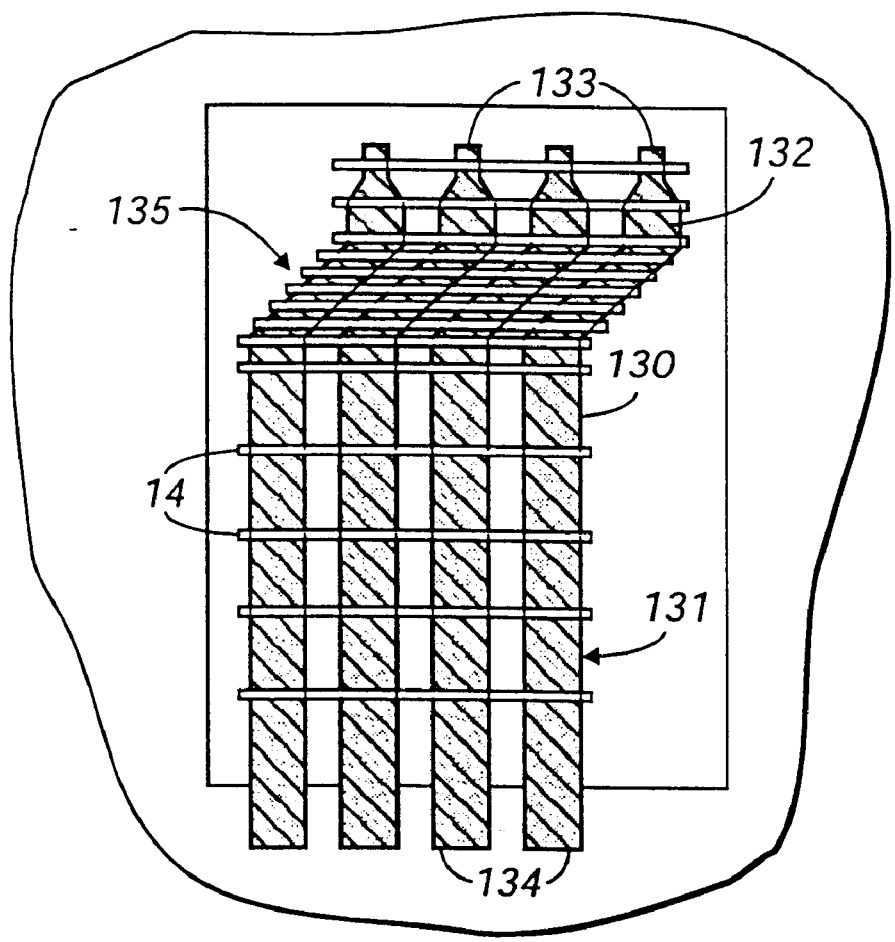
FIG. 9 is a top view of an alternate layout of four elastic members before release.

An alternative layout for a series of elastic members to be released to form a closed loop structure is shown in FIG. 9. In this embodiment, each elastic member 130 is patterned into two segments. The first segment 131 extends from anchor portion 134 until it reaches second segment 132. Second segment 132 is patterned at an angle from first segment 131 and is terminated by tip portion 133. A plurality of tethers 14 are added to maintain the spacing between the elastic members 130. When the release layer is removed, tip 133 is released followed by second segment 132 and then segment 131. When tip 133 contacts contact 134 of the adjacent member, the resulting loop is not acircular. The mid-air jog, which occurs where the first and second segments join 135, allows the free end 133 to return to the take-off point with an axial offset.

The resistance of the loop closure may be reduced by connecting the free end of a loop back to a contact pad on the substrate with low resistance. Obtaining low resistance at the contact pad requires a good metallurgical junction consisting of highly conducting materials. Coil structures incorporating a solder pad that is reflowed to close the loop achieves a good metallurgical junction as well as low contact resistance. Alternatively, the free end may be joined to the contact pad by plating, either electroless or electroplating. In this method, the loop is formed by releasing the elastic member. The free end comes into either mechanical contact or proximity to a contact pad on the inductor substrate. Then, plating applies conducting material around both the free end and the contact pad, forming a continuous joint between them. In this embodiment, the application of material need not be limited to the free and the pad areas only. Preferably, the plated material has high conductivity, and is plated throughout the loop in order to reduce the coil resistance, thereby beneficially increasing the quality factor.

It is desired from a reliability standpoint to have as wide a pad area as possible in order to accommodate possible axial offsets of the spring ends with respect to their bases. This offset could for example be caused by helical bending due to stress anisotropies, or due to displacement of the fingers due to surface tension forces during wet processing.

Figure 10:
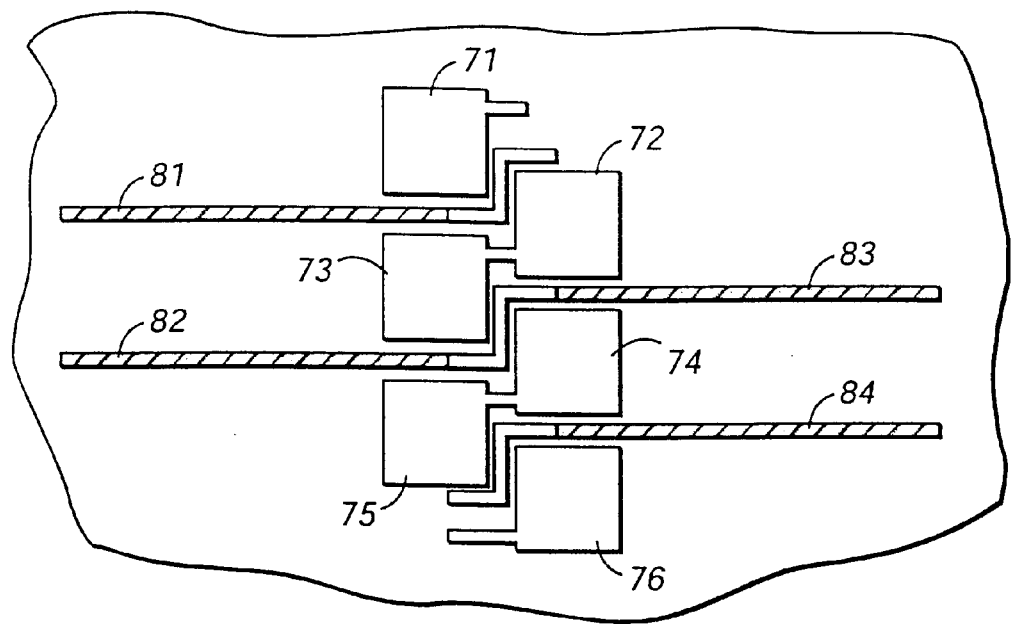
FIGS. 10 and 11 are top views of a bi-directional elastic member layout.
Figure 11:
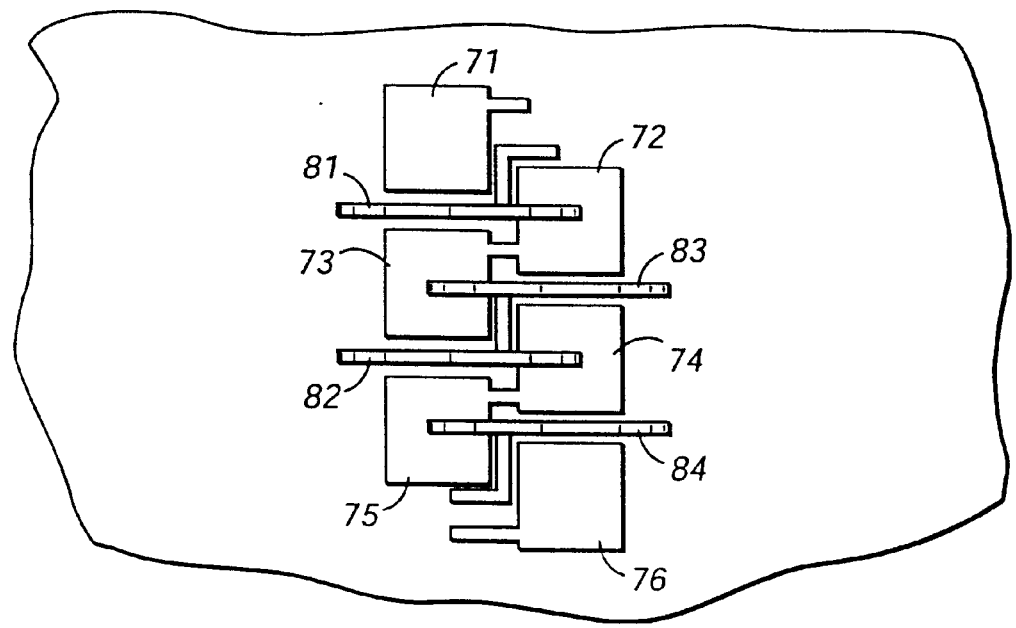

One possible way to extend the pad area is to release elastic members from opposite directions. This also enables the released elastic members to be made wider. FIGS. 10 (before release) and 11 (after release) show a schematic of the layout. In FIG. 10, elastic members 81 and 82 are laid out to release from the left to the right. Elastic members 83 and 84 are laid out to release from right to left. Oversized contact pads 71, 72, 73, 74 75 and 76 are also shown. This design is advantageous if the undercut can be minimized. A problem may arise in that the release window that opens to allow the springs to lift, will also allow the release etch to advance toward the adjacent pad. Normally, the undercut etch of the release layer is about 30% larger than the undercut needed to release the springs. So, if the undercut needed is 20 microns, the undercut allowed for is about 25 microns. This may be too large in some cases.

A solution to the undercut problem is to clear the conducting release layer between the spring metal traces before applying the release window. This has the drawback that the release layer then cannot be as easily used as a common cathode for electroplating. The technique may work for electroless plating, however the conductance of electroless plated metals is typically lower than what is achievable with electroplating. Conductance has to be kept extremely high in order to meet the quality factor requirements of some applications.

Making the elastic members release from two sides and interleave does not permit the use of tethers since tethers would prevent interleaving. Without tethers, some stiffness and spacing rules may need to be made more conservative in order to prevent entanglement or shorting. Dense toroids designed to lift with their spring tips to the outside and landing pads to the center would not likely be a useful application of the bidirectional springs.

The method of the invention permits process extensions. These process flows are exemplary, but other variations are possible. For example, certain process steps described herein may be combined or eliminated. Layers of solder used to close the loop, could also serve as the release window for the spring release step.

On-chip out-of-plane coil structures produced in accordance with the invention have numerous practical applications. For example, when produced with inductance values in the range of 1 to 100 nH, the out-of-plane inductor coil structures are optimally suited for use in mobile RF communication devices that operate in a frequency range of approximately 100 MHz to several GHz. In addition to their use as inductors, the out-of-plane coils can also be used as transformers. Micro-transformers are essential in electronic components such as mixers, double-tuned filters and RF signal transformers. The out-of-plane coils are compatible with a variety of micro-transformer architectures. Examples of micro-transformer designs using the out-of-plane coils are described in the '815 application and the '262 application. Out-of-plane structures made in accordance with the invention may be used in any circuit formed on a substrate which has at least one reactance element. A reactance element is any capacitor, inductor or transformer.

Figure 14:
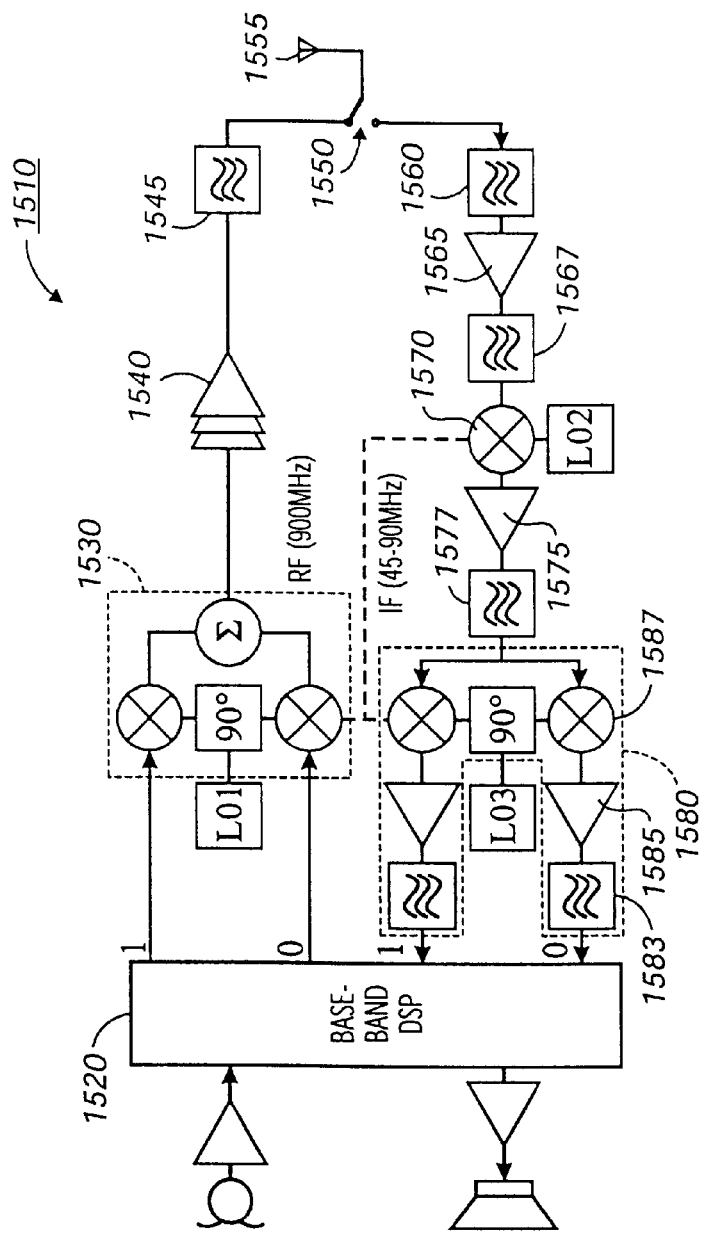
FIG. 14 is a simplified circuit diagram showing the radio circuit section used in the cell phone of FIG. 13.
Figure 13:
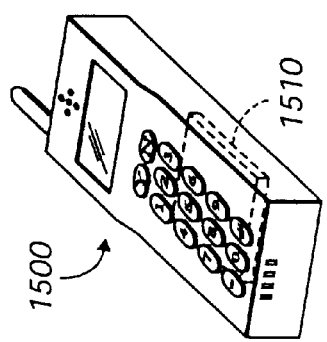
FIG. 13 is a perspective view showing a cell phone incorporating a radio circuit section including an out-of-plane structure formed in accordance with the invention.

FIGS. 13 and 14 are perspective and simplified circuit diagrams showing a Global System for Mobile Communication (GSM) digital cell phone 1500, which is an example of a mobile communication device that is suited for using one or more out-of-plane coil structures of the invention. FIG. 13 shows a circuit substrate in dashed lines that includes a radio circuit section 1510 using the out-of-plane coil structures.

FIG. 14 is a circuit diagram showing radio circuit section 1510 in additional detail. Note that several different modulation schemes and data formats are used in modem cell phones, but radio circuit 1510 is common to all radio circuits in that it involves a combination of amplifiers, modulators, filters and oscillators. A digital signal processor (DSP) 1520 picks up an amplified microphone signal, converts the amplified microphone signal to digital data, and translates the digital data as two, so called I and Q pulse shaped voltage signals that are then phase modulated on a 900 MHz carrier by quadrature modulator 1530. A power amplifier 1540 then amplifies the modulated signals, which are then filtered by a filter 1545 and routed by a switch 1550 to an antenna 1555. The receiver portion of radio circuit section 1510 follows the reverse procedure, often with a two-step frequency conversion for easier channel separation. The antenna signal is first filtered by filter 1560, amplified and filtered by an amplifier 1565 and a filter 1567, and demodulated by mixer 1570 to an intermediate frequency (IF) signal. This IF signal is then amplified by amplifier 1575 and filtered again by filter 1577 to select the channel of interest. The I and Q signals are then recovered by a demodulation circuit 1580 that demodulates the IF signal using two 90° out-of-phase sinusoidal voltages of frequency IF using mixers 1583, amplifiers 1585 and filters 1587. DSP 1520 finally turns the I/Q information back into audio signals to drive a loudspeaker 1590.

In radio circuits such as radio circuit section 1510, out-of-plane coil structures of the invention can be beneficially used, for example, as part of the resonator of a tuned amplifier (e.g., amplifiers 1540 and 1565) or an oscillator (such as local oscillator LO1, which is shown in FIG. 14), as filter components (e.g., filters 1545, 1560, 1567 or 1577), as baluns used by mixer circuit 1530 and demodulation circuit 1580, and as matching elements between two sub-circuits (e.g., modulator 1530 and power amplifier 1540). Some of these specific applications are described in detail below.

The various filters used in the RF and IF circuit sections of radio circuit section 1510 (i.e., filters 1545, 1560, 1567 and 1577) are potential candidates for using the out-of-plane coil structures of the invention. These filters are used in situations where the frequencies are high enough to be compatible with small coil structures.

Antenna filters, such as filters 1545 and 1560, are typically a fairly simple combination of inductors and capacitors in a band-pass configuration. Antenna 1555 picks up RF signals over a wide spectrum of frequencies. Antenna filter 1560 roughly selects the frequency band of interest to cancel out-of-band noise and to reduce the signal level at the receiver input to allow for a higher receiver gain and thus better sensitivity. Inductor-capacitor filters are used in this situation instead of resistor-capacitor filters because of the noise and loss correlated to resistors. The out-of-plane coil structures of the invention can be used as antenna-filter inductors. The filter capacitors can be implemented as part of the circuit integrated on the die underneath the out-of-plane coil structures in cases where the IC process includes capacitors, or can be added after fabrication on top of the substrate in IC processes that do not include capacitor fabrication steps.

Figure 15:
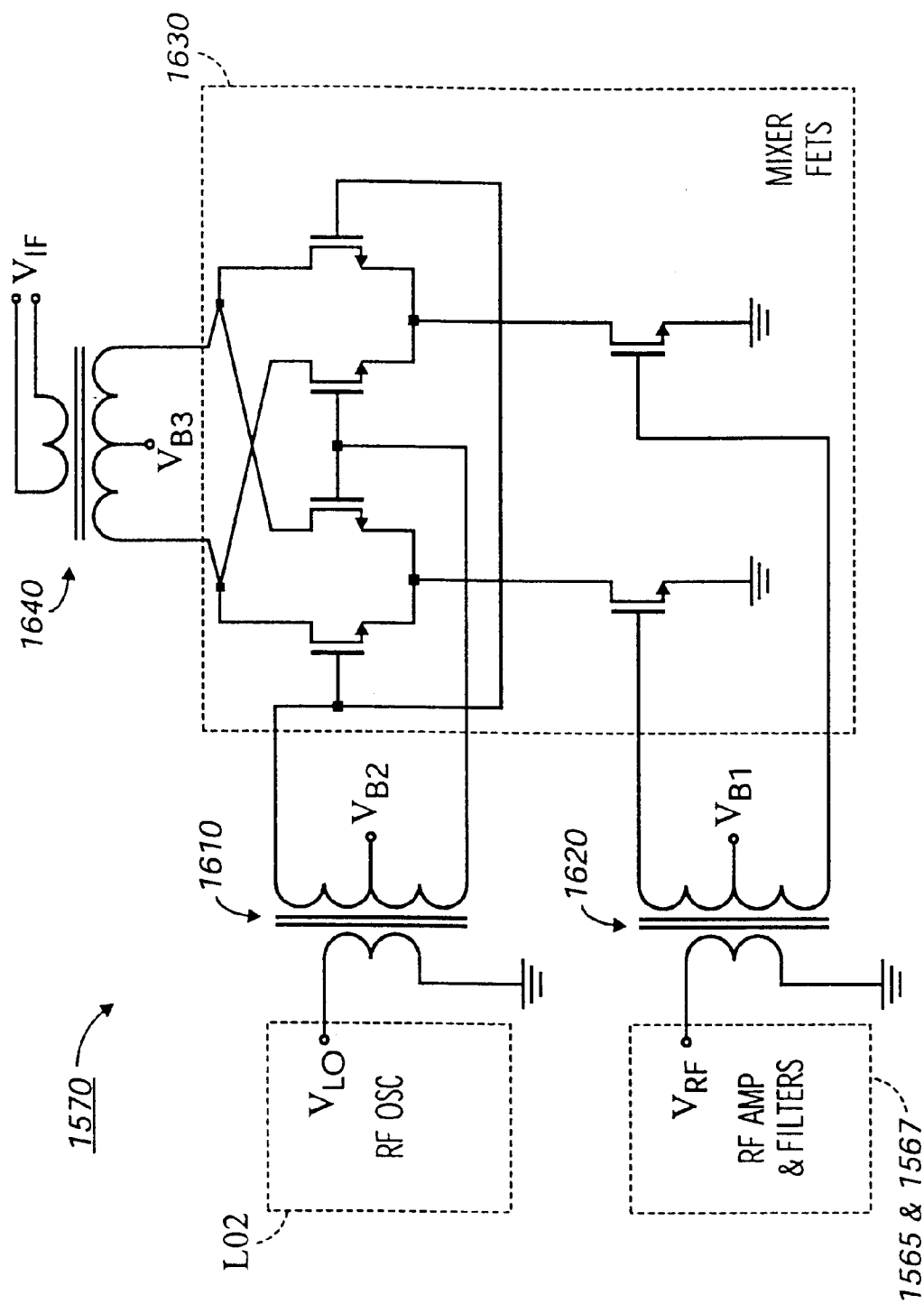
FIGS. 15 and 16 are simplified circuit and perspective views showing a mixer circuit used in the cell phone shown in FIG. 13.
Figure 16:
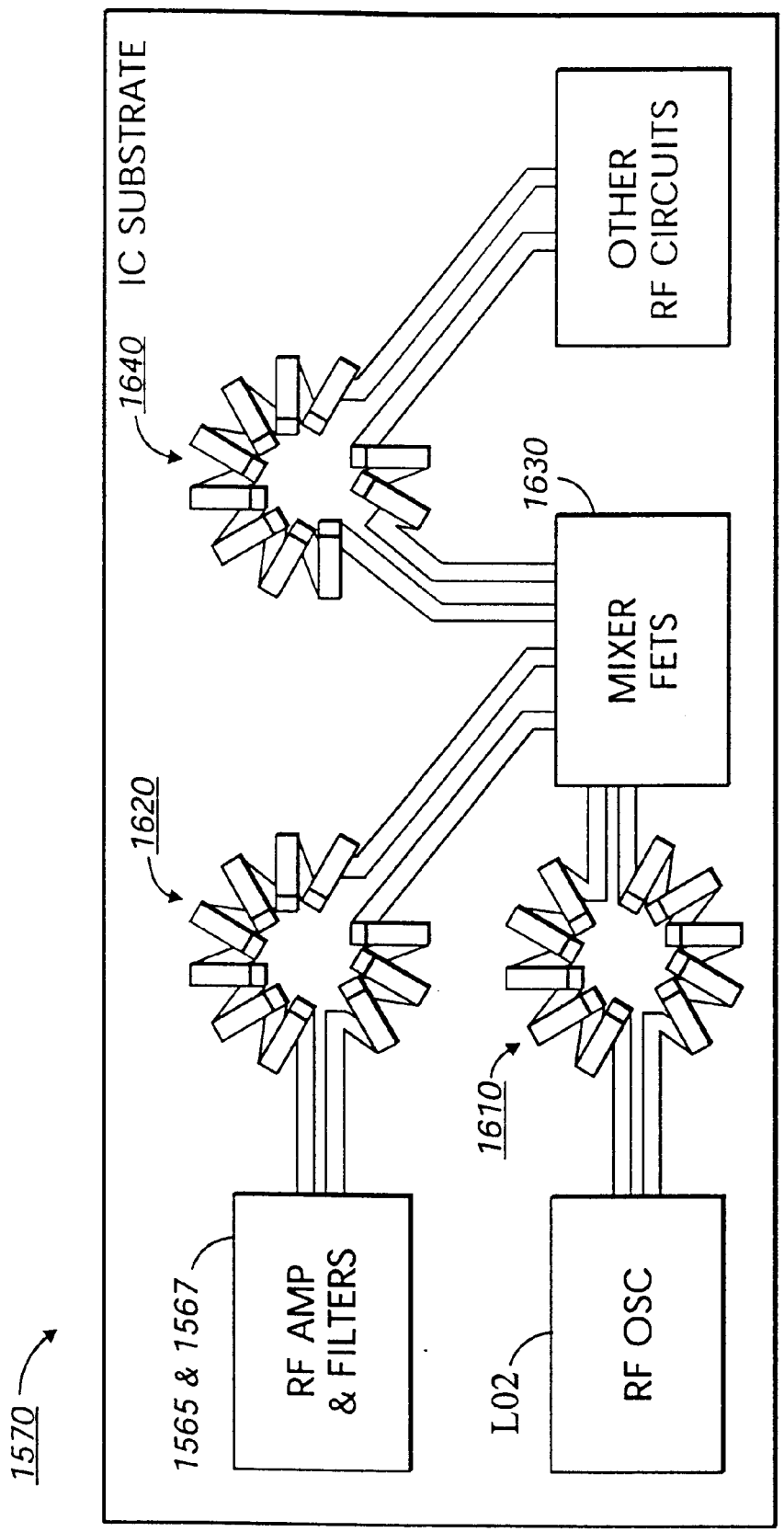

FIGS. 15 and 16 are simplified circuit and perspective diagrams showing an example of a double balanced RF-to-IF mixer 1570 of radio circuit section 1510. RF-to-IF mixer 1570 is based on the Gilbert multiplier, and is disclosed in "RF and Microwave Circuit Design for Wireless Communications," Larson L. E., Editor, Artech House Publishers, Boston, London, 1997 (page 273, FIG. 5.33).

Referring to FIG. 15, RF-to-IF mixer 1570 includes a first balun 1610 for receiving a reference signal $V_{LO}$ from RF local oscillator LO2, a second balun 1620 for receiving amplified signal $V_{RF}$, a mixer FET circuit 1630, and a third balun 1640 for generating an IF output signal that is transmitted to amplifier 1575, filter 1577 and demodulation circuit 1580. Mixer FET circuit 1630 is indicated as being implemented using NMOS technology, but can also be made using bipolar transistors or JFETs. Baluns 1610, 1620 and 1640 convert asymmetric signals into symmetric signals and vice versa in a manner known in the art.

FIG. 16 is a perspective view showing RF-to-IF mixer 1570 arranged on an IC substrate 1600. Other components of radio circuit section 1510 are omitted for clarity. In accordance with the invention, baluns 1610, 1620 and 1640 are implemented using transformer arrangement of out-of-plane coil structures.

RF receiver amplifiers (e.g., amplifier 1565) often use inductors instead of resistors for the load and the emitter degeneration for low-noise operation (no thermal kTR noise). Power amplifier 1540 also often contains inductors instead of resistors for better efficiency (no $RI^2$ losses in resistors) and higher output swing up to two times the supply voltage instead of one time as with a resistor load. Examples of these amplifiers are disclosed in "RF and Microwave Circuit Design for Wireless Communication" at pages 368 and 385.

The local oscillators LO1 and LO2 of radio circuit section 1510 are typically phase-locked-loop (PLL) circuits. The purpose of the PLL is to generate an adjustable frequency signal with the accuracy and stability of a crystal oscillator. A frequency-divided output of the voltage-controlled oscillator is compared to a reference signal generated by the crystal oscillator. As soon as the phase of the VCO deviates from the reference signal, the phase comparator outputs a voltage that adjusts the VCO frequency. A filter is typically provided between the phase comparator and the VCO to assure loop stability. The VCO can be forced to run at different frequencies by adjusting the scale-down factor of the frequency scalar.

VCOs are a special class of oscillators in which the resonance frequency of the resonator is voltage dependent. This is most often accomplished by combining a fixed coil with a variable capacitor. Commercial VCOs use varactor diodes as tuning capacitors. MEMs varactors are described in copending, coassigned U.S. patent application Ser. No. 09/573,363 filed May 17, 2000, which is incorporated herein by reference. The out-of-plane coil structures of the invention are perfectly suited in the VCO resonator for the fixed coil used with such a varactor.

While the invention has been described with reference to specific embodiments, the description of the specific embodiments is illustrative only and is not to be construed as limiting the scope of the invention. Various other modifications and changes may occur to those skilled in the art without departing from the spirit and scope of the invention.

What is claimed is:

1. A method for forming an out-of-plane structure, comprising:

depositing a layer of an elastic material on a substrate, the elastic material having an intrinsic stress profile;

photolithographically patterning the layer of elastic material into an elastic member;

depositing a reflow load layer along a portion of a surface of the elastic member, wherein the reflow load layer is formed of a material capable of being reflowed;

under-cut etching a portion of the substrate under the elastic member to release a free end of the elastic member from the substrate, an anchor portion of the elastic member remaining fixed to the substrate;

wherein the intrinsic stress profile in the elastic member biases the free end away from the substrate, forming a spring having an initial radius of curvature determined in part by the initial condition of the reflow toad layer; and reflowing the reflow material in the reflow load layer to control the radius of curvature of the spring, wherein reflowing of the reflow material in the load layer changes the load effect of the load layer, thereby changing the initial radius of curvature of the spring.

2. The method of claim 1, wherein reflowing the load layer comprises heating the reflow load layer after release of the elastic member, wherein heating the reflow load layer reduces the loading effect of the load layer.

3. The method of claim 1, wherein the reflow material comprises photoresist and wherein reflowing the load layer comprises plasma ashing the reflow load layer after release of the elastic member, wherein plasma ashing of the reflow load layer reduces the loading effect of the load layer.

4. The method of claim 1, wherein the intrinsic stress profile in the elastic member biases the free end of the member away from the substrate forming a loop winding and causing a free end of each of the elastic members to contact a point on the substrate.

5. The method of claim 4, further comprising connecting the free end to the substrate.

6. The method of claim 5, further comprising removing the reflow material.

7. A method for forming an out-of-plane structure, comprising:

depositing a layer of an elastic material on a substrate, the elastic material having an intrinsic stress profile;

photolithographically patterning the layer of elastic material into an elastic member;

depositing a load layer along a portion of a surface of the elastic member, wherein the load layer comprises a plurality of layers;

under-cut etching a portion of the substrate under the elastic member to release a free end of the elastic member from the substrate, an anchor portion of the elastic member remaining fixed to the substrate;

wherein the intrinsic stress profile in the elastic member biases the free end of the structure away from the substrate, forming a spring having an initial radius of curvature determined in part by the initial condition of the load layer; and selectively etching at least one of the plurality of layers of the load layer to control the radius of curvature of the spring, wherein etching of the plurality of layers in the load layer changes the load effect of the load layer, thereby changing the initial radius of curvature of the spring.

8. The method of claim 7, wherein the plurality of load layers is formed prior to the photolithographic patterning step.

9. The method of claim 7, wherein the intrinsic stress profile in the elastic member biases the free portion of the member away from the substrate forming a loop winding and causing a free end of each of the elastic members to contact a point on the substrate.

10. The method of claim 7, wherein selectively etching of the load layers occurs prior to release of the elastic member.

11. The method of claim 7, wherein selectively etching of the load layers occurs after release of the elastic member.

\* \* \* \* \*